(12) United States Patent
Kohyama et al.

(10) Patent No.: US 6,326,691 B1
(45) Date of Patent: *Dec. 4, 2001

(54) SEMICONDUCTOR DEVICE AND METHOD FOR MANUFACTURING THE SAME

(75) Inventors: Yusuke Kohyama, Yokosuka; Souichi Sugiura, Yamato, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/429,642

(22) Filed: Oct. 29, 1999

Related U.S. Application Data

(63) Continuation of application No. 08/694,194, filed on Aug. 8, 1996, which is a continuation of application No. 08/319,633, filed on Oct. 7, 1994, now Pat. No. 5,545,926.

(30) Foreign Application Priority Data

Oct. 12, 1993 (JP) .................................................. 5-254217

(51) Int. Cl.[7] ........................ H01L 23/48; H01L 23/482; H01L 23/485; H01L 23/52; H01L 23/522

(52) U.S. Cl. ........................ 257/754; 257/755; 257/757; 257/758; 438/622; 438/630; 438/637; 438/647; 438/655; 438/656; 438/657

(58) Field of Search ..................... 257/770, 754, 257/755, 757, 758; 438/622, 630, 637, 647, 656, 657

(56) References Cited

U.S. PATENT DOCUMENTS

| | | | |
|---|---|---|---|
| 4,322,736 | 3/1982 | Sasaki et al. | 257/774 |
| 4,874,719 | 10/1989 | Kohyama et al. | |
| 4,994,889 | 2/1991 | Takeuchi et al. | 257/296 |

(List continued on next page.)

FOREIGN PATENT DOCUMENTS

| | | |
|---|---|---|
| 43 06 322 | 9/1993 | (DE) . |
| 0 018 175 | 10/1980 | (EP) . |
| 0 056 908 | 8/1982 | (EP) . |

(List continued on next page.)

OTHER PUBLICATIONS

Japanese Office Action, App. No. 6–192526, Mailed May 16, 2000 (Japanese and English translation).

Japanese Office Action, App. No. 6–192526, Mailed Oct. 31, 2000 (Japanese and English translation).

1987 Symposium on VLSL Technology, Digest of Technical Papers, p. 93 (A High Density 4Mbit dRAM Process Using a Fully Overlapping Bitline Contact (FOBIC) Trench Cell, K.H. Kusters, et al. (1987).

Japanese Language and full English translation of an Office Action from the Japanese Patent Office, May 16, 2000, 7 pp., Examiner Akira Kawai.

*Primary Examiner*—Olik Chaudhuri
*Assistant Examiner*—Ginette Peralta
(74) *Attorney, Agent, or Firm*—Banner & Witcoff, Ltd.

(57) ABSTRACT

A first contact hole for a bit line is formed in an interlayer insulating film, and a polysilicon film is formed on the inner surface of the contact hole and on the interlayer insulating film. Subsequently, the polysilicon film is subjected to isotropic dry etching using a resist as a mask, and the interlayer insulating film is subjected to RIE etching, thereby forming a second contact hole in the interlayer insulating film in a peripheral circuit region. Then, a laminated film is formed on the inner surface of the second contact hole and on the polysilicon film, and the second contact hole is filled with a filling member. The laminated film and the polysilicon film are patterned, thereby forming a bit line in a memory cell region.

16 Claims, 9 Drawing Sheets

U.S. PATENT DOCUMENTS

| | | | |
|---|---|---|---|
| 5,025,741 | 6/1991 | Suwanai | 438/385 |
| 5,132,771 | 7/1992 | Yamanaka et al. | 257/524 |
| 5,237,187 | 8/1993 | Suwanai et al. | 257/296 |
| 5,294,822 | 3/1994 | Verrett | 257/755 |
| 5,317,187 * | 5/1994 | Hindman et al. | 257/659 |
| 5,374,591 * | 12/1994 | Hasegawa et al. | 438/626 |
| 5,479,054 | 12/1995 | Tottori | 257/752 |
| 5,545,926 | 8/1996 | Kohyama et al. . | |
| 5,837,604 * | 11/1998 | Jun | 438/641 |

FOREIGN PATENT DOCUMENTS

| | | | |
|---|---|---|---|
| 0 349 107 | 1/1990 | (EP) . | |
| 51-19478 | 2/1976 | (JP) . | |
| 60-242662 | 12/1985 | (JP) . | |
| 61-131558 | 6/1986 | (JP) . | |
| 59-208856 | 11/1986 | (JP) . | |
| 62-241372 | 10/1987 | (JP) | 257/752 |
| 63-260065 | 10/1988 | (JP) . | |
| 1-120863 | 5/1989 | (JP) . | |
| 1-313972 | 12/1989 | (JP) | 257/755 |
| 2-40935 | 2/1990 | (JP) | 257/774 |
| 2-65170 | 3/1990 | (JP) . | |
| 2-110933 | 4/1990 | (JP) . | |
| 2-186625 | 7/1990 | (JP) . | |
| 2-249264 | 10/1990 | (JP) . | |
| 3-041727 | 2/1991 | (JP) . | |
| 3-280467 | 12/1991 | (JP) . | |
| 3-292767 | 12/1991 | (JP) . | |
| 4-62870 | 2/1992 | (JP) . | |
| 04-134859 | 5/1992 | (JP) . | |
| 04-335569 | 11/1992 | (JP) . | |
| 4-345065 | 12/1992 | (JP) . | |
| 5-013434 | 1/1993 | (JP) . | |

* cited by examiner

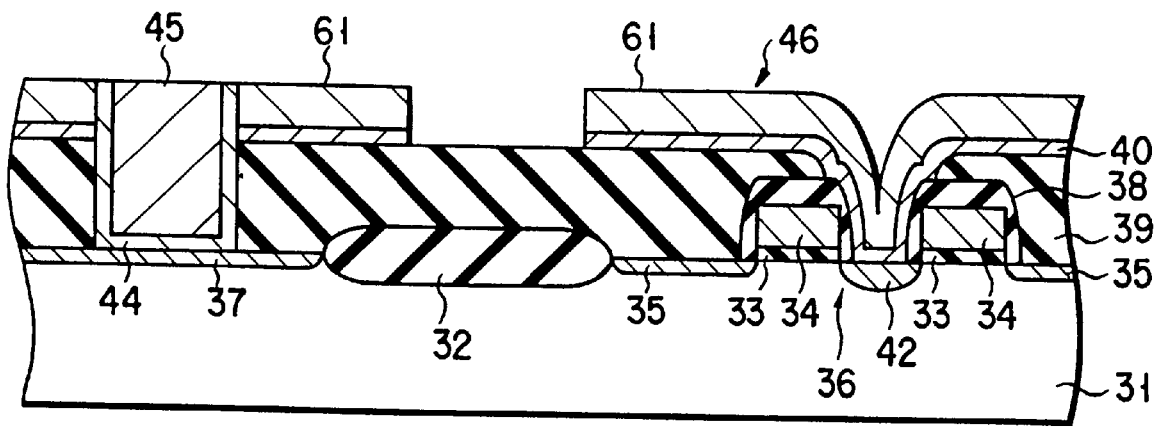
F I G. 18
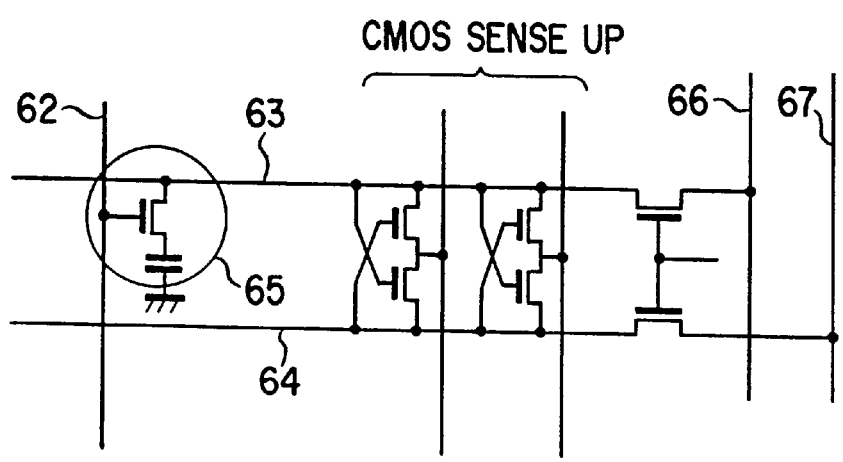
F I G. 20

SEMICONDUCTOR DEVICE AND METHOD FOR MANUFACTURING THE SAME

This application is a continuation of Ser. No. 08/694,194 Aug. 8, 1996 which is a continuation of Ser. No. 08/319,633 Oct. 7, 1994 U.S. Pat. No. 5,545,926.

BACKGROUND OF THE INVENTION

1. Field of the Invention

This invention relates to a semiconductor device and a method for manufacturing the same, and more particularly to a semiconductor device with wiring which has contacts of low resistance.

2. Description of the Related Art

FIGS. 1–3 are cross sectional views, illustrating a method for manufacturing a first conventional semiconductor device, i.e. a DRAM (Dynamic Random Access Read Write Memory). First, an element-separating oxide film 2 is formed on a P-type silicon substrate 1, thereby separating the surface thereof into a memory cell region 1a and a peripheral circuit region 1b. Then, a gate insulating film 3 is formed on the P-type silicon substrate 1. Gate electrodes 4 each of which is incorporated in a transistor 6 for data transmission are provided on the gate insulating film 3 in the memory cell region 1a. A gate electrode for a driving transistor (not shown) is formed on the gate insulating film 3 in the peripheral circuit region 1b.

Subsequently, ions of an impurity are injected into the P-type silicon substrate 1, using as masks the gate electrodes of the transistors 6 for data transmission and the gate electrode of the driving transistor. As a result, diffusion layers 15 and 5 for forming the source and drain regions of the driving transistor and the data-transmitting transistors 6 are formed in the P-type silicon substrate 1. In other words, the data-transmitting transistors 6 each consisting of the gate insulting film 3, the gate electrode 4 and the diffusion layer 5 serving as the source/drain region are formed in the memory cell region 1a. The driving transistor is formed in the peripheral circuit region 1b. The memory cell region has a capacity for data accumulation. These transistors 6 and the data accumulation capacity form one memory cell.

Thereafter, an insulating film 7 is formed on the side surfaces and the upper surfaces of the gate electrodes 4. An interlayer insulating film 8 is formed on the insulating film 7, the P-type silicon substrate 1, and the element-separating oxide film 2. Then, a first contact hole 8a for a bit line is formed in the interlayer insulating film 8 such that the hole 8a is aligned with the gate electrodes 4, by the use of FOBIC (Fully overlapping Bitline Contact) described in 1987 Symposium on VLSI Technology, Digest of Technical Papers, p. 93. Subsequently, a second contact hole 8b is formed in the interlayer insulating film 8 in the peripheral circuit region 1b.

As is shown in FIG. 2, a polysilicon film 9 having a thickness of about 1000 Å is deposited on the interlayer insulating film 8 and on the inner surfaces of the first and second contact holes 8a and 8b by means of the CVD (Chemical vapor Deposition). Thereafter, about $5 \times 10^{15}$ cm$^{-2}$ of ions of an N-type impurity 10 such as phosphorus or arsenic are injected into the P-type silicon substrate 1, using the interlayer insulating film 8 as a mask. As a result, N-type diffusion layers 11 and 12 of high density are formed in the surface portions of the substrate 1 which are located under the first and second holes 8a and 8b.

Thereafter, as is shown in FIG. 3, a WSi$_2$ film 13 having a thickness of about 2000 Å is deposited on the polysilicon film 9 by sputtering. Then, the WSi$_2$ film 13 and the polysilicon film 9 are patterned by the lithography and the RIE (Reactive Ion Etching), thereby forming a bit line 14 as a polycide wire which has a laminated structure of the WSi$_2$ film 13 and the polysilicon film 9. The WSi$_2$ film 13 is annealed at a relatively high temperature, e.g. 800–950° C., so as to activate the diffusion layer and stabilize the film 13.

Since in the above-described first conventional semiconductor device, the P-type silicon substrate 1 and the polysilicon film 9 contact each other in the first and second contact holes 8a and 8b, the contact resistance in each of the holes cannot be reduced, although the rate of PN-junction failure can be reduced. As regards the contact resistance of the bit line contact in the memory cell region 1a, it suffices if the contact resistance is lower than the channel resistance of the data-transmitting transistor 6. This means that the contact resistance of the bit line is not necessarily set to a very low value, and may be set, for example, to about 1 kΩ. On the other hand, the contact resistance in the second contact hole 8b in the peripheral circuit region 1b must be set to a low value with respect to the channel resistance of the driving transistor, i.e., to a value of as low as several tens Ω. The above-described manufacturing method cannot satisfy the requirement that the contact resistance in the peripheral circuit region 1b be kept to a very low value, as the degree of integration increases.

FIGS. 4 and 5 are cross sectional views, illustrating a method for manufacturing a second conventional semiconductor device. In these figures, elements similar to those employed in the first conventional semiconductor device are denoted by corresponding reference numerals, and an explanation will be given of only different elements.

As is shown in FIG. 4, a laminated film 21 consisting of a TiN upper layer and a Ti lower layer is formed, by sputtering, on the interlayer insulating film 8 and on the inner surface of each of the first and second contact holes 8a and 8b. Then, the resultant structure is annealed at a relatively low temperature, for example, of about 600° C., thereby forming a TiSi$_2$ film on the bottom of each of the first and second contact holes 8a and 8b.

Thereafter, as is shown in FIG. 5, a metal film 22 of W or the like is deposited on the laminated film 21 by the CVD. Subsequently, the metal film 22 and the laminated film 21 are patterned by the lithography and the RIE, thereby forming in the memory cell region 1a a bit line 23 consisting of the laminated film 21 and the metal film 22.

As described above, in the above-described second conventional semiconductor device, the P-type silicon substrate 1 contacts the Ti lower layer of the laminated film 21 in each of the first and second contact holes 8a and 8b. Therefore, the contact resistance is made low in the contact holes 8a and 8b, but the rate of pn-junction failure is high since a silicide is formed as a result of reaction of Ti and Si in the contact portion of the P-type silicon substrate 1 and the Ti layer. In other words, silicon contained in the N-type diffusion layers 11 and 12 becomes a silicide as a result of reaction of Ti and Si in the contact portion, so that pn-junction failure is liable to occur in the N-type diffusion layers 11 and 12.

Forming deep N-type diffusion layers 11 and 12 is considered to prevent the failure. However, although deep diffusion layers can prevent the failure, they reduce the withstand voltage between adjacent elements. This is because the distance between the adjacent elements is shorten as their size is reduced. Therefore, the diffusion layers 11 and 12 cannot actually be made deep, and accordingly the pn-junction failure cannot be prevented.

The occurrence of the pn-junction failure is especially disadvantage to the bit line contacts in the memory cell region 1a, since the number of the bit line contacts in the memory cell region 1a is much larger than that of the contacts in the peripheral circuit region 1b. Specifically, where the number of the contacts in the peripheral circuit region 1b is several tens thousands, the number of the bit line contacts in the memory cell region 1a is several millions. Thus, the method for manufacturing the second conventional semiconductor device cannot satisfy the requirement that the rate of pn-junction failure in the memory cell region 1a be kept low.

FIG. 6 is a cross sectional view, showing a CMOS DRAM as a third conventional semiconductor device. In FIG. 5, elements similar to those employed in the first conventional semiconductor device are denoted by corresponding reference numerals, and an explanation will be given of only different elements.

First, a P-type well region 28 and an N-type well region 29 are formed in a P-type silicon substrate 1. Then, first and second element-separating oxide films 2a and 2b are formed on the P-type silicon substrate 1. The first element-separating oxide film 2a divides the surface of the P-type silicon substrate 1 into a memory cell region 1a and a peripheral circuit region 1b.

N-type diffusion layers 5 and 15 for forming the source and drain regions are formed in the P-type well region 28, and a P-type diffusion layer 17 is formed in the N-type well region 29.

Then, a first interlayer insulating film 8 is formed on the P-type silicon substrate 1, and the element-separating oxide films 2a and 2b. A first contact hole 8a for a bit line is formed in the interlayer insulating film 8 in the memory cell region 1a such that the hole 8a is aligned with gate electrodes 4. Subsequently, a polysilicon film 9 having a thickness of about 1000 Å is deposited on the interlayer insulating film 8 and on the inner surface of the first contact hole 8a by means of the CVD. Thereafter, N-type diffusion layer 11 of high density is formed in the surface portion of the P-type silicon substrate 1 which is located under the first hole 8a.

Thereafter, a $WSi_2$ film 13 is deposited on the polysilicon film 9. Then, the $WSi_2$ film 13 and the polysilicon film 9 are patterned by the lithography and the RIE, thereby forming, in the memory cell region 1a, a bit line 14 as a polycide wire which has a laminated structure of the $WSi_2$ film 13 and the polysilicon film 9, and a polycide wire 16 in the peripheral circuit region 1b. The $WSi_2$ film 13 is then annealed.

Subsequently, a second interlayer insulating film 18 is deposited on the first interlayer insulating film 8, the bit line 14, and the polycide wire 16. Third and fourth contact holes 18a and 18b and a fifth contact hole (not shown) are formed in the first and second interlayer insulating films 8 and 18. Further, a sixth contact hole 18d is formed in the second interlayer insulating film 18. The third contact hole 18a extends to the N-type diffusion layer 15, while the fourth contact hole 18b extends to the P-type diffusion layer 17. The fifth contact hole extends to a gate electrode (not shown), while the sixth contact hole 18d extends to the polycide wire 16 located at a level identical to that of the bit line.

Then, a laminated film (not shown) consisting of a TiN upper layer and a Ti lower layer is deposited on the inner surfaces of the third through sixth contact holes 18a, 18b, 18d, and on the second interlayer insulating film 18. An Al alloy film is formed on the laminated film. Thereafter, the laminated film and the Al alloy film are patterned, therefore a first Al wire 19 is formed on the second interlayer insulating film 18. A third interlayer insulating film 20 is deposited on the first Al wire 19 and the second interlayer insulating film 18. A seventh contact hole 20a is formed in the interlayer insulating film 20 such that it extends to the first Al wire 19. A second Al wire 24 is formed on the inner surface of the seventh contact hole 20a and on the third interlayer insulating film 20.

In the above-described method for manufacturing the third conventional semiconductor device, the rate of pn-junction failure can be kept low since the P-type silicon substrate 1 contacts the polysilicon film 9 in the first contact hole 8a. The contact resistance can be reduced, since the diffusion layers 15 and 17 contact the first Al wire 19 in the third and fourth contact holes 18a and 18b. In this case, however, since the third and fourth contact holes 18a and 18b have a great depth, it is possible that the Al wire 19 is broken in the hole 18a or 18b.

SUMMARY OF THE INVENTION

It is a first object of the invention to provide a semiconductor device which has a low rate of PN-junction failure in a memory cell region and has a low contact resistance in a peripheral circuit region, and also provide a method for manufacturing the semiconductor device.

It is a second object of the invention to provide a semiconductor device which has a low rate of PN-junction failure in a memory cell region and a low contact resistance in a peripheral circuit region and which is free from a breakage of a wire in a contact hole, and also provide a method for manufacturing the semiconductor device.

To attain the first object, there are provided the following device and method:

A semiconductor device comprising:
an insulating film formed on a semiconductor substrate;
a first contact hole formed in the insulating film;
a first diffusion layer formed in the surface of the semiconductor substrate and to which the first contact hole extends;
a semiconductor film formed on the inner surface of the first contact hole and on the insulating film;
a second contact hole formed in the semiconductor film and the insulating film;
a second diffusion layer formed in the surface of the semiconductor substrate and to which the second contact hole extends; and
a film containing at least a metal and formed on the inner surface of the second contact hole and on the semiconductor film.

A method of manufacturing a semiconductor device, comprising the steps of:
forming first and second diffusion layers in the surface of a semiconductor substrate;
forming an insulating film on the semiconductor substrate;
forming a first contact hole in the insulating film such that the first contact hole extends to the first diffusion layer;
forming a semiconductor film on the inner surface of the first contact hole and on the insulating film;
forming a second contact hole in the semiconductor film and the insulating film such that the second contact hole extends to the second diffusion layer; and
forming a film, containing at least a metal, on the inner surface of the second contact hole and on the semiconductor film.

To attain the second object, there are provided the following device and method:

A semiconductor device comprising:

a semiconductor substrate having a memory cell region and a peripheral circuit region;

a first-conductive type diffusion layer of a first MOSFET formed in the surface of the semiconductor substrate in the memory cell region;

a first-conductive type diffusion layer of a second MOSFET formed in the surface of the semiconductor substrate in the peripheral circuit region;

a second-conductive type diffusion layer of a third MOSFET formed in the surface of the semiconductor substrate in the peripheral circuit region;

a first insulating film formed on the semiconductor substrate;

a first contact hole formed in the first insulating film and extending to the first-conductive type diffusion layer of the first MOSFET;

a semiconductor film formed on the inner surface of the first contact hole and on the insulating film;

a second contact hole formed in the semiconductor film and the first insulating film and extending to the first-conductive type diffusion layer of the second MOSFET;

a third contact hole formed in the semiconductor film and the first insulating film and extending to the second-conductive type diffusion layer of the third MOSFET;

a film containing at least a metal and formed on the inner surfaces of the second and third contact holes and on the semiconductor film;

a metal film formed on the film containing at least the metal;

a second insulating film formed on the metal film;

a fourth contact hole formed in the second insulating film and extending to the metal film; and an Al alloy wire formed on the inner surface of the fourth contact hole and on the second insulating film.

A method of manufacturing a semiconductor device, comprising the steps of:

forming first-conductive type diffusion layers of first and second MOSFETs in the surface of a semiconductor substrate in a memory cell region and a peripheral circuit region, respectively;

forming a second-conductive type diffusion layer of a third MOSFET in the surface of the semiconductor substrate in the peripheral circuit region;

forming a first insulating film on the surface of the semiconductor substrate;

forming a first contact hole in the first insulating film such that it extends to the first-conductive type diffusion layer of the first MOSFET;

forming a semiconductor film on the inner surface of the first contact hole and on the first insulating film;

forming second and third contact holes in the semiconductor film and the first insulating film such that they extend to the first-conductive type diffusion layer of the second MOSFET and the second-conductive type diffusion layer of the third MOSFET, respectively;

forming a film containing at least a metal, on the inner surfaces of the second and third contact holes and on the semiconductor film;

forming a metal film on the film containing at least the metal;

forming a second insulating film on the metal film;

forming a fourth contact hole in the second insulating film such that it extends to the metal film; and forming an Al alloy wire on the inner surface of the fourth contact hole and on the second insulating film.

Since in the invention, the semiconductor substrate is in contact with the semiconductor film in the first contact hole, the rate of PN-junction failure can be restrained. Further, since the semiconductor substrate is in contact with the film containing at least the metal, the contact resistance can be minimized in the second contact hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 18 is a cross sectional view, useful in explaining the method for manufacturing the semiconductor device according to the fifth embodiment, and showing a process performed next to that shown in FIG. 17;

FIG. 20 is a circuit diagram, showing a CMOS sense amplifier in a memory cell region.

DETAILED DESCRIPTION OF THE PREFERRED EMBODIMENTS

Figure 1:
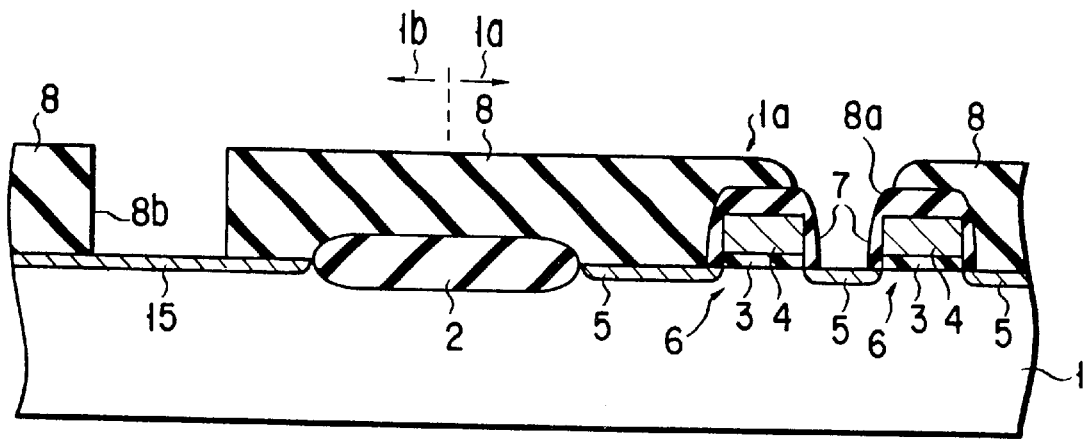
FIG. 1 is a cross sectional view, useful in explaining a method for manufacturing a first conventional semiconductor device.
Figure 2:
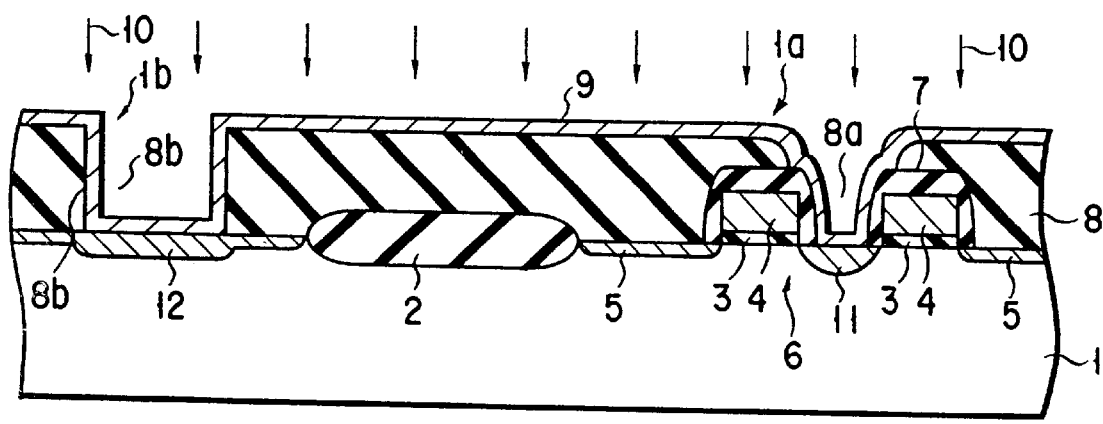
FIG. 2 is a cross sectional view, showing a process performed next to that shown in FIG. 1.
Figure 3:
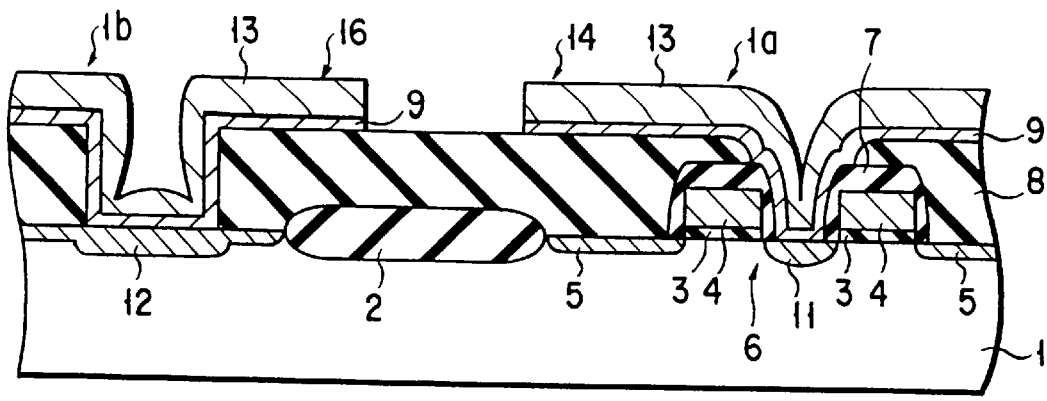
FIG. 3 is a cross sectional view, showing a process performed next to that shown in FIG. 2.
Figure 4:
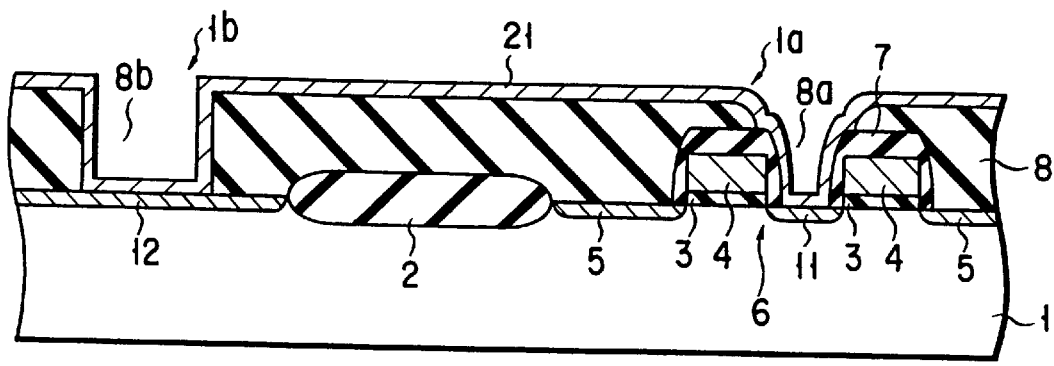
FIG. 4 is a cross sectional view, useful in explaining a method for manufacturing a second conventional semiconductor device.
Figure 5:
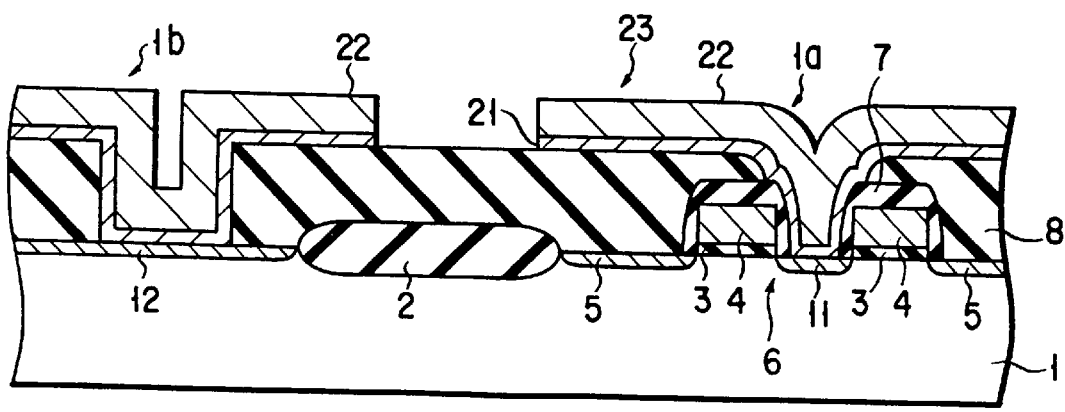
FIG. 5 is a cross sectional view, showing a process performed next to that shown in FIG. 4.
Figure 6:
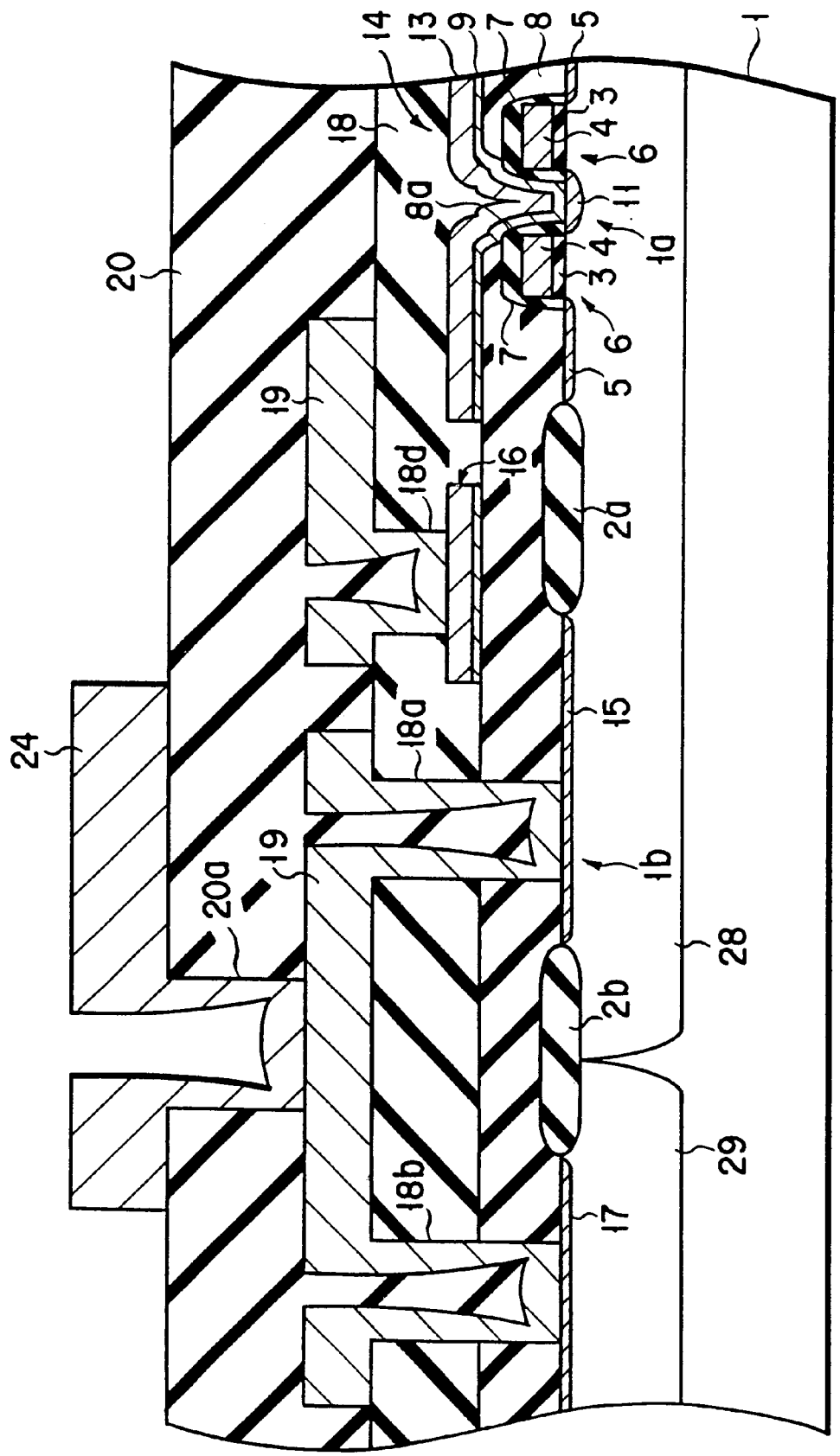
FIG. 6 is a cross sectional view, showing a third conventional semiconductor device.
Figure 7:
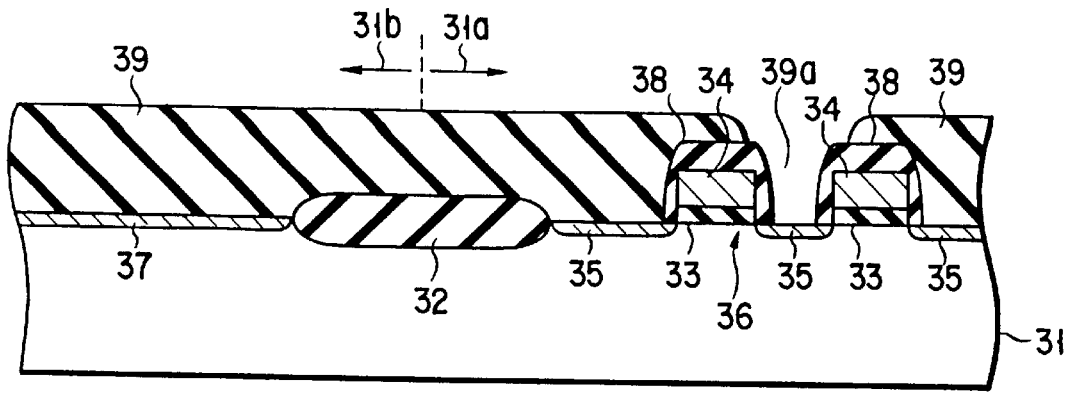
FIG. 7 is a cross sectional view, useful in explaining a method for manufacturing a semiconductor device according to a first or fifth embodiment of the invention.

The embodiments of the invention will be explained with reference to the accompanying drawings.

FIGS. 7–11 are cross sectional views, illustrating a method for manufacturing a semiconductor device according to a first embodiment of the invention, i.e., a DRAM. First, an element-separating film 32 is formed on a P-type silicon substrate 31, thereby dividing the substrate 31 into a memory cell region 31a and a peripheral circuit region 31b. Then, a gate insulating film 33 is formed on the substrate 31. Gate electrodes 34 for data transmitting transistors 36 are provided on the gate insulating film 33 in the memory cell region 31a. A gate electrode for a driving transistor (not shown) is provided on the gate insulating film 33 in the peripheral circuit region 31b.

Thereafter, ion injection is performed using as masks the gate electrodes of the driving transistor and the data-transmitting transistor 36, thereby forming in the P-type silicon substrate 1 diffusion layers 37 and 35 which serve as the source/drain regions of the driving transistor and the data-transmitting transistors 36. Thus, the data-transmitting transistors 36 each consisting of the gate insulating film 33, the gate electrode 34 and the diffusion layer 35 serving as a source/drain region is formed in the memory cell region 31a, while the driving transistor is formed in the peripheral circuit region 31b. The diffusion layer 37 in the peripheral circuit region 31b has a density higher than the diffusion layer 35 in the memory cell region 31a, so that the diffusion layer 35 can be brought into contact with a polysilicon film in the memory cell region 31a, while the diffusion layer 37 can be brought into contact with a metal in the peripheral circuit region 31b. In other words, in the case of bringing the diffusion layer 35 into contact with a polysilicon film, it is necessary to keep the density of the diffusion layer 35 low so as to minimize the growth of a natural oxide film on the layer 35. On the other hand, in the case of bringing the diffusion layer 37 into contact with a metal, it is necessary to keep the density of the diffusion layer 37 high so as to enable ohmic contact. The memory cell region 31a has a capacitor for accumulating data.

An insulating film 38 is formed on the upper and side surfaces of each gate electrode 34. An interlayer insulating film 39 is formed on the insulating film 38, the P-type silicon substrate 31 and the element-separating oxide film 32. Then, a first contact hole 39a for a bit line is formed in the interlayer insulating film 39 such that the hole 39a is aligned with the gate electrodes 34, by the use of FOBIC.

Figure 8:
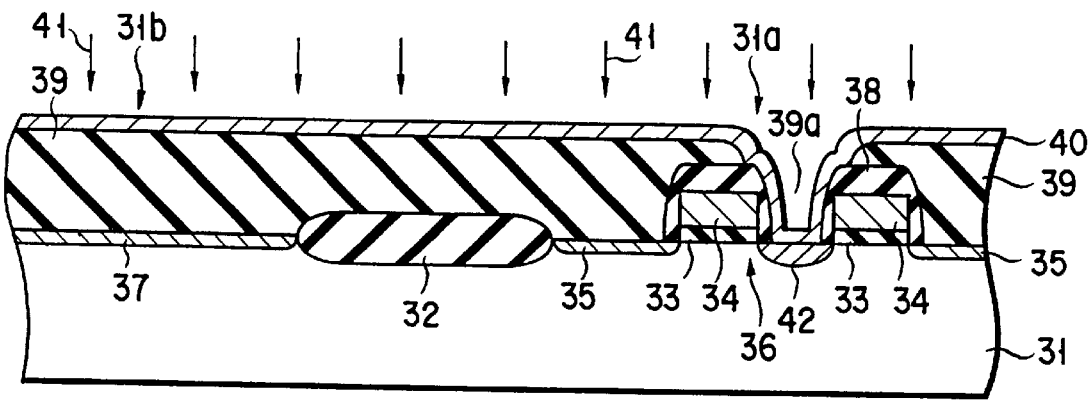
FIG. 8 is a cross sectional view, useful in explaining the method for manufacturing the semiconductor device according to the first or fifth embodiment, and showing a process performed next to that shown in FIG. 7.

As is shown in FIG. 8, a semiconductor film, for example, a polysilicon film 40, having a thickness of about 1000 Å is deposited on the interlayer insulating film 39 and on the inner surface of the first contact hole 39a by means of the CVD. Thereafter, about $5 \times 10^{15}$ cm$^{-2}$ of ions of an N-type impurity 41 such as phosphorus, arsenic or the like are injected into the P-type silicon substrate 31, using the interlayer insulating film 39 as a mask. The P-type silicon substrate 31 is annealed for activation at a relatively high temperature, for example, of about 800–950° C. As a result, a deep N-type diffusion layer 42 of high density is formed in the surface portion of the substrate 31 which is located under the first contact hole 39a for a bit line.

Figure 9:
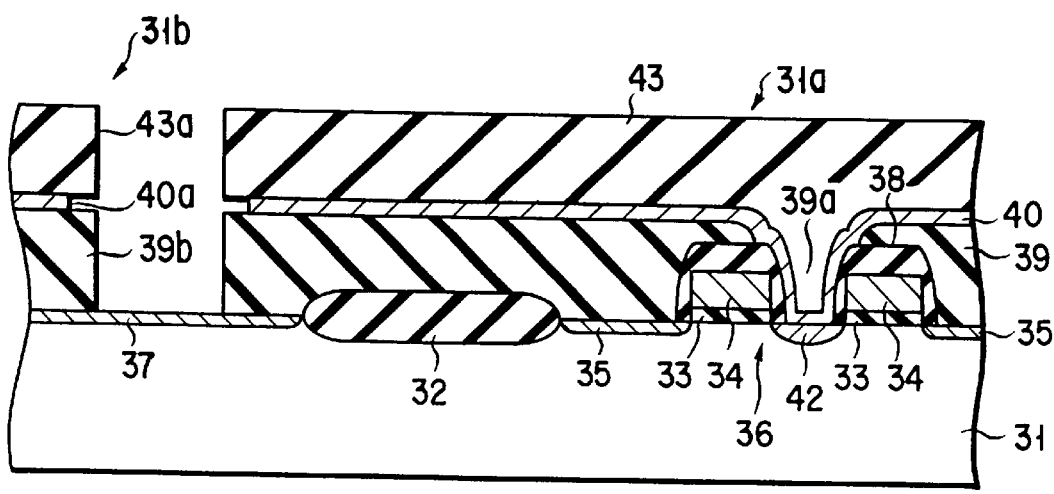
FIG. 9 is a cross sectional view, useful in explaining the method for manufacturing the semiconductor device according to the first embodiment, and showing a process performed next to that shown in FIG. 8.

Thereafter, as is shown in FIG. 9, a resist 43 is coated on the polysilicon film 40, and a mask pattern 43a is formed by patterning the resist 43 by lithography. Then, the polysilicon film 40 is subjected to isotropic dry etching, using the resist 43 as a mask. Subsequently, the interlayer insulating film 39 is etched by the RIE, using the resist 43 as a mask. As a result, a second contact hole 39b is formed in the portion of the interlayer insulating film 39 which is located in the peripheral circuit region 31b, such that it extends to the diffusion layer 37 as the source/drain region. The contact hole 39b has a diameter smaller than the hole formed in the polysilicon film 40 by dry etching. Thus, a step portion 40a is formed between the polysilicon film 40 and the interlayer insulating film 39 in the vicinity of the second contact hole 39b. The step portion 40a is provided for preventing an overhang from being formed at a peripheral portion of the second contact hole 39b.

Figure 10:
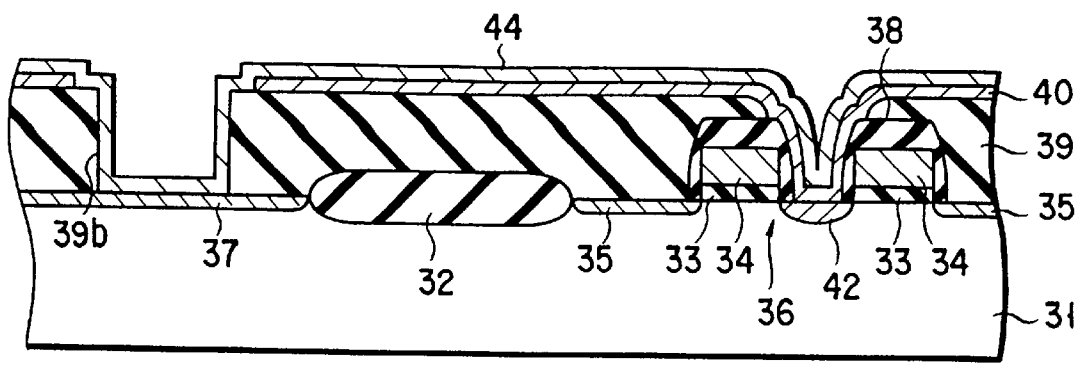
FIG. 10 is a cross sectional view, useful in explaining the method for manufacturing the semiconductor device according to the first embodiment, and showing a process performed next to that shown in FIG. 9.

Thereafter, as is shown in FIG. 10, the resist 43 is removed, and a laminated film 44 consisting of a TiN upper layer and a Ti lower layer is formed, by sputtering, on the inner surface of the second contact hole 39b and on the polysilicon film 40, or at least on the portion of the polysilicon film 40 in the vicinity of the second contact hole 39b. Subsequently, resultant structure is annealed at a relatively low temperature of e.g. 600° C., thereby forming a TiSi$_2$ film (not shown) on the bottom of the second contact hole 39b.

Figure 11:
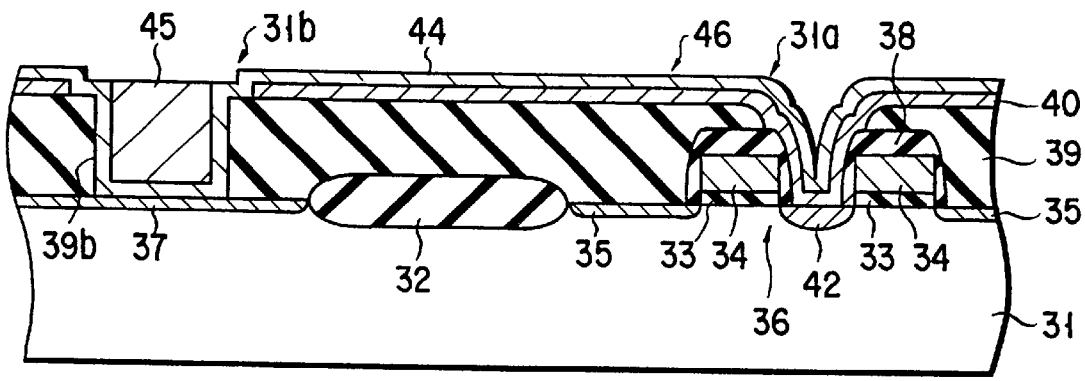
FIG. 11 is a cross sectional view, useful in explaining the method for manufacturing the semiconductor device according to the first embodiment, and showing a process performed next to that shown in FIG. 10.

Then, as is shown in FIG. 11, in order to flatten the surface of the laminated film 44, a filling member 45 such as an amorphous silicon film doped with an impurity of high density or a W film is filled in the second contact hole 39b by the use of an etching-back method. Subsequently, the laminated film 44 and the polysilicon film 40 are simultaneously patterned by the lithography and the RIE, thereby forming in the memory cell region 31a a bit line 46 consisting of the laminated film 44 and the polysilicon film 40.

In the above-described first embodiment, the P-type silicon substrate 31 is in contact with the polysilicon film 40 in the first contact hole 39a in the memory cell region 31a, while the P-type silicon substrate 31 is in contact with the Ti layer as the lower layer of the laminated film 44 in the second contact hole 39b in the peripheral circuit region 31b. Accordingly, a multiplicity of bit line contacts in the memory cell region 31a can be free from pn-junction failure. Further, the contact resistance in the contact hole 39b in the peripheral circuit region 31b can be kept at a sufficiently low value relative to the channel resistance of the driving transistor. As a result, contacts are formed, which can satisfy both the requirement that the rate of PN-junction failure be reduced in the memory cell region 31a and the requirement that the contact resistance in the peripheral circuit region 31b be reduced in accordance with high integration.

Moreover, although in the first embodiment, the laminated film 44 consisting of the TiN upper layer and the Ti lower layer is formed on the inner surface of the second contact hole 39b and on the polysilicon film 40, a metal silicide can be formed thereon. In other words, a film which contains at least a metal can be formed on the inner surface of the second contact hole 39b and on the polysilicon film 40, in place of the laminated film 44.

Figure 12:
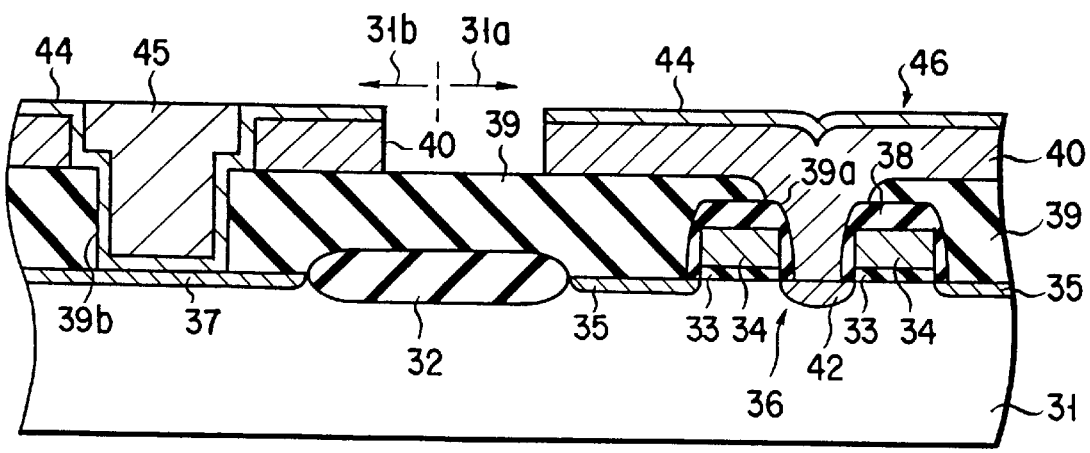
FIG. 12 is a cross sectional view, showing a semiconductor device according to a second embodiment of the invention.

FIG. 12 is a cross sectional view, showing a semiconductor device according to a second embodiment of the invention. In FIG. 12, elements similar to those in FIG. 11 are denoted by corresponding reference numerals, and an explanation will be given only of different elements.

A polysilicon film 40 which has a thickness greater than a half of the diameter of the bit line contact is deposited on the inner surface of the first contact hole 39a and on the interlayer insulating film 39, thereby filling the first contact hole 39a with the film 40.

The second embodiment can provide the same advantage as the first embodiment. Further, in the second embodiment, at the time of forming a $TiSi_2$ film on the bottom of the second contact hole 39b by annealing, a silicide is created also at the boundary between the polysilicon film 40 and the laminated film 44. However, since the first contact hole 39a is filled with the polysilicon film 40, the silicide is created only on an upper portion of the first contact hole 39a. As a result, the influence of stress of creation of the silicide upon a pn-junction in a lower portion of the first contact hole 39a can be minimized. Accordingly, the rate of pn-junction failure can be further reduced.

Figure 13:
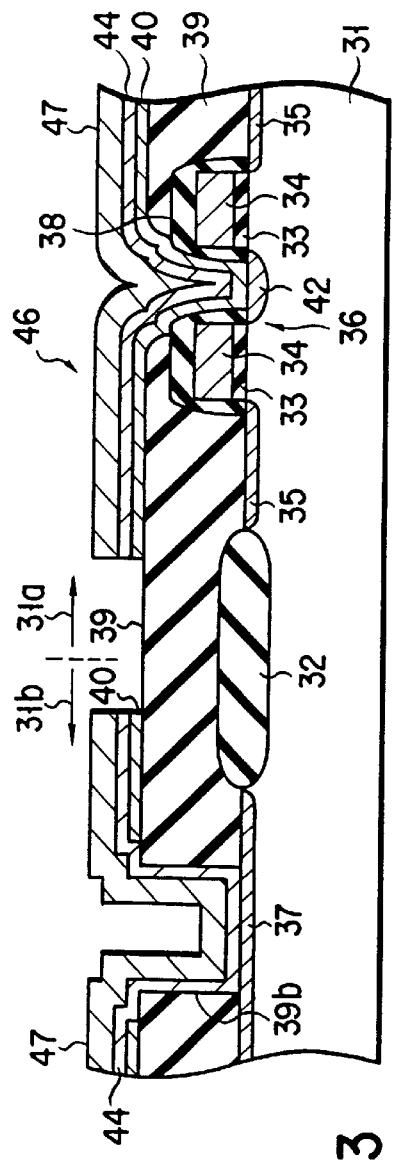
FIG. 13 is a cross sectional view, showing a semiconductor device according to a third embodiment of the invention.

FIG. 13 is a cross sectional view, showing a semiconductor device according to a third embodiment of the invention. In FIG. 13, elements similar to those shown in FIG. 11 are denoted by corresponding reference numerals, and an explanation will be given only of different elements.

After a $TiSi_2$ film is formed on the bottom of the second contact hole 39b, a metal (such as W) film 47 is foamed on the laminated film 44, and the second contact hole 39b is not completely filled with the film 47.

Thereafter, the metal film 47, the laminated film 44 and the polysilicon film 40 are simultaneously patterned by the lithography and the RIE, thereby forming, in the memory cell-region 31a, a bit line 46 consisting of the metal film 47, the laminated film 44 and the polysilicon film 40.

The third embodiment can provide the same advantage as the first embodiment. Moreover, since the metal (e.g. W) film 47 is formed by the CVD, the steps can be sufficiently covered. Thus, there is no possibility of breakage of a line in the contact hole, and hence it is not necessary to fill the contact hole. As a result, the filling process can be omitted, that is, the number of processes can be reduced, enhancing the yield of production.

Figure 14:
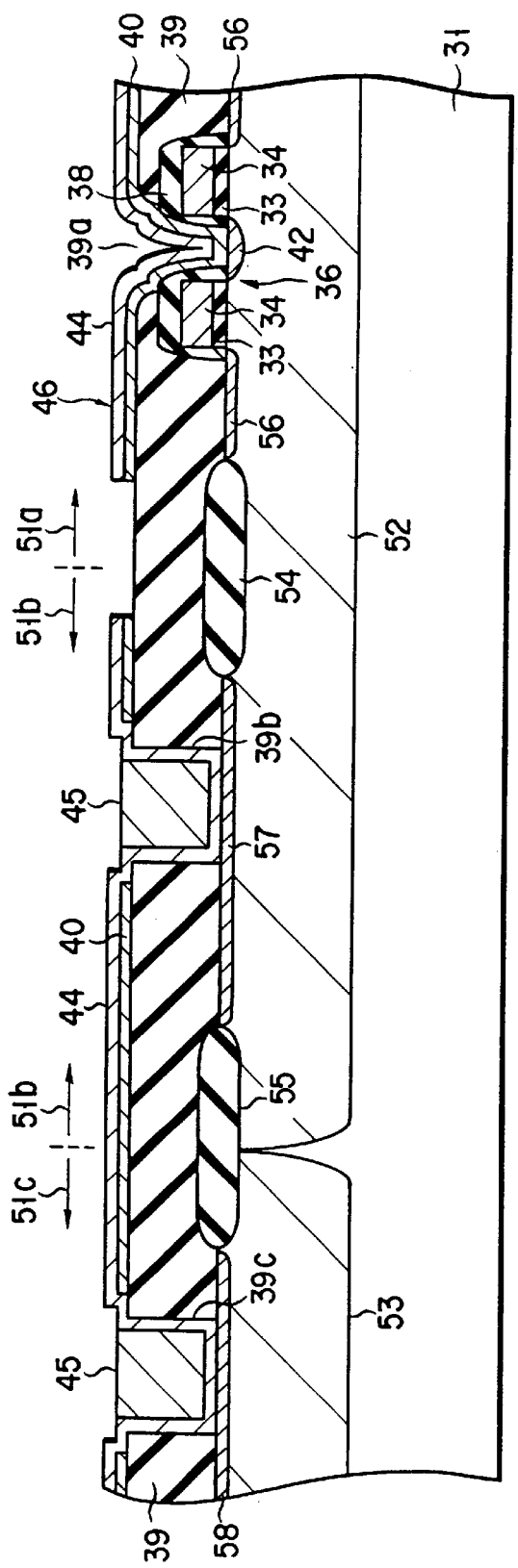
FIG. 14 is a cross sectional view, showing a semiconductor device according to a fourth embodiment of the invention.

FIG. 14 is a cross sectional view, showing a CMOS DRAM according to a fourth embodiment of the invention. In FIG. 14, elements similar to those in FIG. 11 are denoted by corresponding reference numerals, and an explanation will be given only of different elements.

A P-type well region 52 and an N-type well region 53 are formed in the surface of the P-type silicon substrate 31, and then first and second element separating films 54 and 55 are formed on the surface of the substrate 31 to divide the substrate 31 into a memory cell region 51a, an N-type channel peripheral circuit region 51b and a P-type channel peripheral circuit region 51c. Subsequently, gate electrodes for respective driving transistors (not shown) are provided on those portions of a gate insulating film 33 which are located in the N-type and P-type channel peripheral circuit regions 51b and 51c.

Thereafter, an $N^-$-type diffusion layer 56 which serves as a source/drain region of a data transmitting transistor 36 is formed in the substrate 31 in the memory cell region 51a. An $N^+$-type diffusion layer 57 which serves as a source/drain region is formed in the P-type silicon substrate 31 in the N-type channel peripheral circuit region 51b. A $P^+$-type diffusion layer 58 which serves as a source/drain region is formed in the P-type silicon substrate 31 in the P-type channel peripheral circuit region 51c.

Then, the first contact hole 39a is formed, and the polysilicon film 40 and the interlayer insulating film 39 are etched, using a resist (not shown) as a mask, thereby forming second and third contact holes 39b and 39c in the interlayer insulating film 39 in the N-type channel peripheral circuit region 51b and the P-type channel peripheral circuit region 51c, respectively.

The laminated film 44 consisting of the TiN upper layer and the Ti lower layer is formed on the inner surfaces of the second and third contact holes 39b and 39c and on the polysilicon film 40. $TiSi_2$ films (not shown) are formed on the bottom surfaces of the second and third contact holes 39b and 39c.

The second and third contact holes 39b and 39c are filled with the filling member 45.

The above-described fourth embodiment can provide the same advantage as the first embodiment.

Further, since in the fourth embodiment, the $N^+$-type diffusion layer 57 as the source/drain region is connected to the $P^+$-type diffusion layer 58 as the source/drain region, via the laminated film 44. Accordingly, an $N^+$-type impurity contained in the $N^+$-type diffusion layer 57 and an $P^+$-type impurity contained in the $P^+$-type diffusion layer 58 are prevented from mixing with each other.

Therefore, the above embodiment can avoid a problem which will occur if the aforementioned first conventional semiconductor device is applied to a CMOS DRAM, i.e., the problem that the $N^+$-type impurity and the $P^+$-type impurity are inevitably mixed with each other via a polycide wire (consisting of a polysilicon film and a WSi film) to thereby increase the contact resistance, where the $N^+$-type diffusion layer 57 is connected to the $P^+$-type diffusion layer 58 by means of the polycide wire. The mixing of the $N^+$-type impurity and the $P^+$-type impurity through the polycide wire is performed in the annealing process. It is effective means for fine elements that the $N^+$-type diffusion layer 57 is connected to the $P^+$-type diffusion layer 58, via the laminated film 44. This invention is every effectively applicable to a CMOS sense amplifier as shown in FIG. 20, which has a peripheral circuit region wherein fine elements are highly integrated. In FIG. 20, reference numeral 62 indicates a word line, reference numeral 63 and 64 bit lines, reference numeral 65 a memory cell, and reference numeral 66 and 67 I/O lines.

As described above, in the fourth embodiment, the second and third contact holes 39b and 39c are formed in the polysilicon film 40 and the interlayer insulating film 39, the laminated film 44 is formed on the inner surfaces of the first and second contact holes 39b and 39c and on the polysilicon film 40, and thereafter the contact holes are filled with the filling member 45. However, this embodiment may be modified such that a $WSi_2$ film, for example, is formed on the polysilicon film 40, the second and third contact holes 39b and 39c are formed in the $WSi_2$ film, the polysilicon film 40 and the interlayer insulating film 39, the laminated film 44 is formed on the inner surfaces of the first and second contact holes 39b and 39c and on the $WSi_2$ film, the contact holes are filled with the filling member 45, and the exposed portions of the laminated film 44 are removed.

FIGS. 7, 8 and 15–18 are cross sectional views, showing a method for manufacturing a semiconductor device according to a fifth embodiment of the invention. In these figures, elements similar to those in FIG. 11 are denoted by corresponding reference numerals, and an explanation will be given only of different elements.

Figure 15:
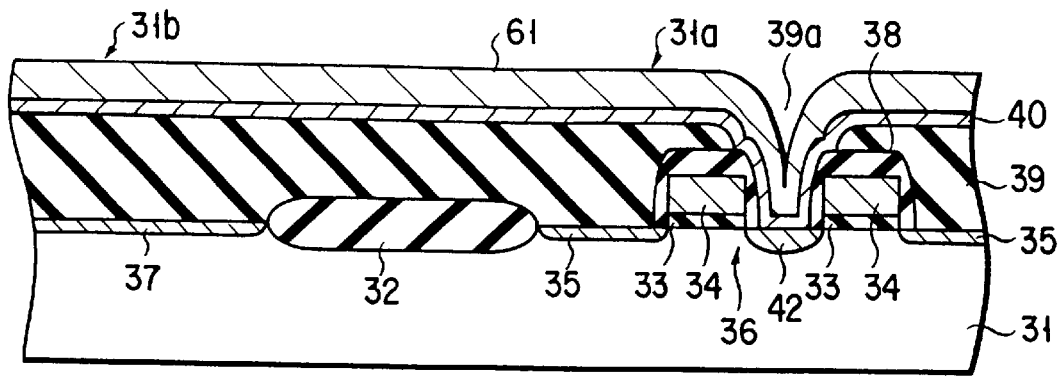
FIG. 15 is a cross sectional view, useful in explaining a method for manufacturing a semiconductor device according to a fifth embodiment, and showing a process performed next to that shown in FIG. 8.

As is shown in FIG. 15, a $WSi_2$ film 61 having a thickness of about 2000 Å is formed on the polysilicon film 40 by sputtering. Then, the $WSi_2$ film 61 is annealed at a relatively high temperature of e.g. about 800–950° C., thereby stabilizing the film 61 and activating diffusion layers 35, 37 and 42.

Figure 16:
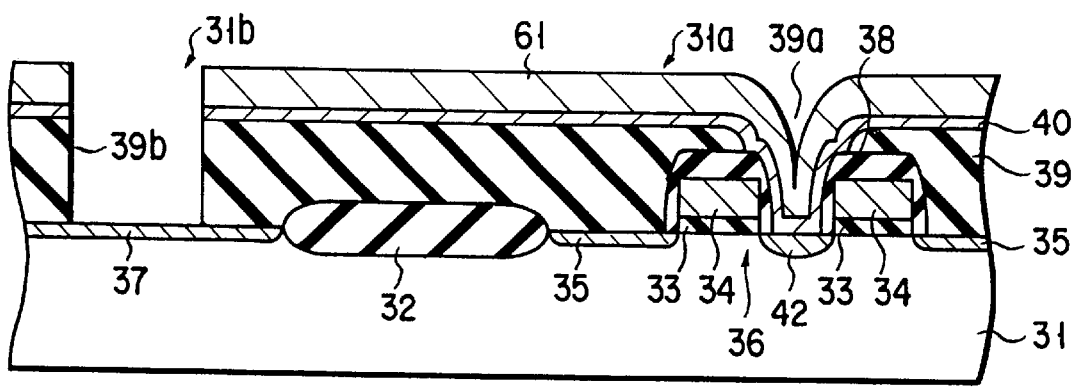
FIG. 16 is a cross sectional view, useful in explaining the method for manufacturing the semiconductor device according to the fifth embodiment, and showing a process performed next to that shown in FIG. 15.

Referring then to FIG. 16, the film 61 is coated with a resist (not shown), and the resist is patterned by the lithography for forming a contact hole. Thereafter, the $WSi_2$ film 61, the polysilicon film 40 and the interlayer insulating film 39 are sequentially etched with the use of the resist as a mask, thereby forming the second contact hole 39b in the interlayer insulating film 39 in the peripheral circuit region 31b such that it extends to the diffusion layer 37 as a source/drain region.

Figure 17:
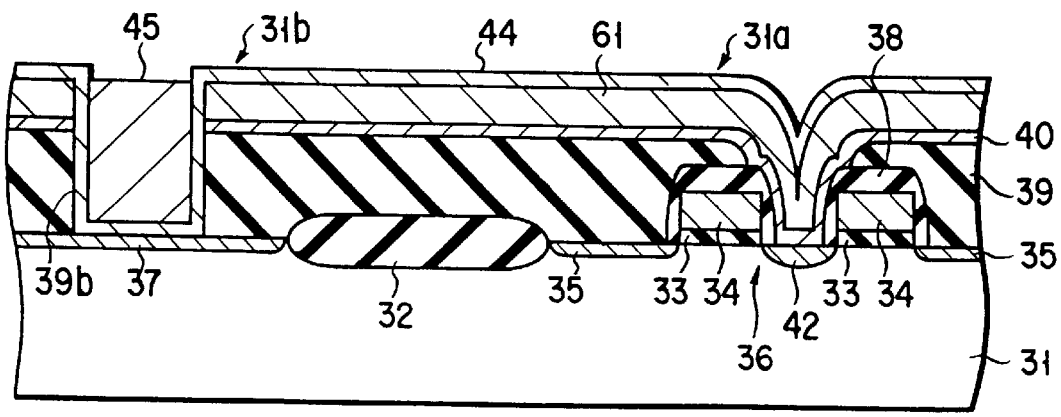
FIG. 17 is a cross sectional view, useful in explaining the method for manufacturing the semiconductor device according to the fifth embodiment, and showing a process performed next to that shown in FIG. 16.

Thereafter, as is shown in FIG. 17, the resist is removed, and the laminated film 44 consisting of the TiN upper layer and the Ti lower layer is formed by sputtering on the inner surface of the second contact hole 39b and on the $WSi_2$ film 61. Then, the $TiSi_2$ film is formed on the bottom of the second contact hole 39b by annealing. The second contact hole 39b is then filled with the filling member 45 by the etching-back method.

Subsequently, as is shown in FIG. 18, the exposed portions of the laminated film 44 are removed, and the $WSi_2$ film 61 and the polysilicon film 40 are simultaneously patterned by the lithography and the RIE, thereby forming a bit line 46 consisting of the $WSi_2$ film 61 and the polysilicon film 40.

The fifth embodiment can provide the same advantage as the first embodiment.

Although in the fifth embodiment, the $WSi_2$ film 61 and the polysilicon film 40 are patterned after removing the laminated film 44, the laminated film 44, the $WSi_2$ film 61 and the polysilicon film 40 may be simultaneously patterned without removing the laminated film 44.

Figure 19:
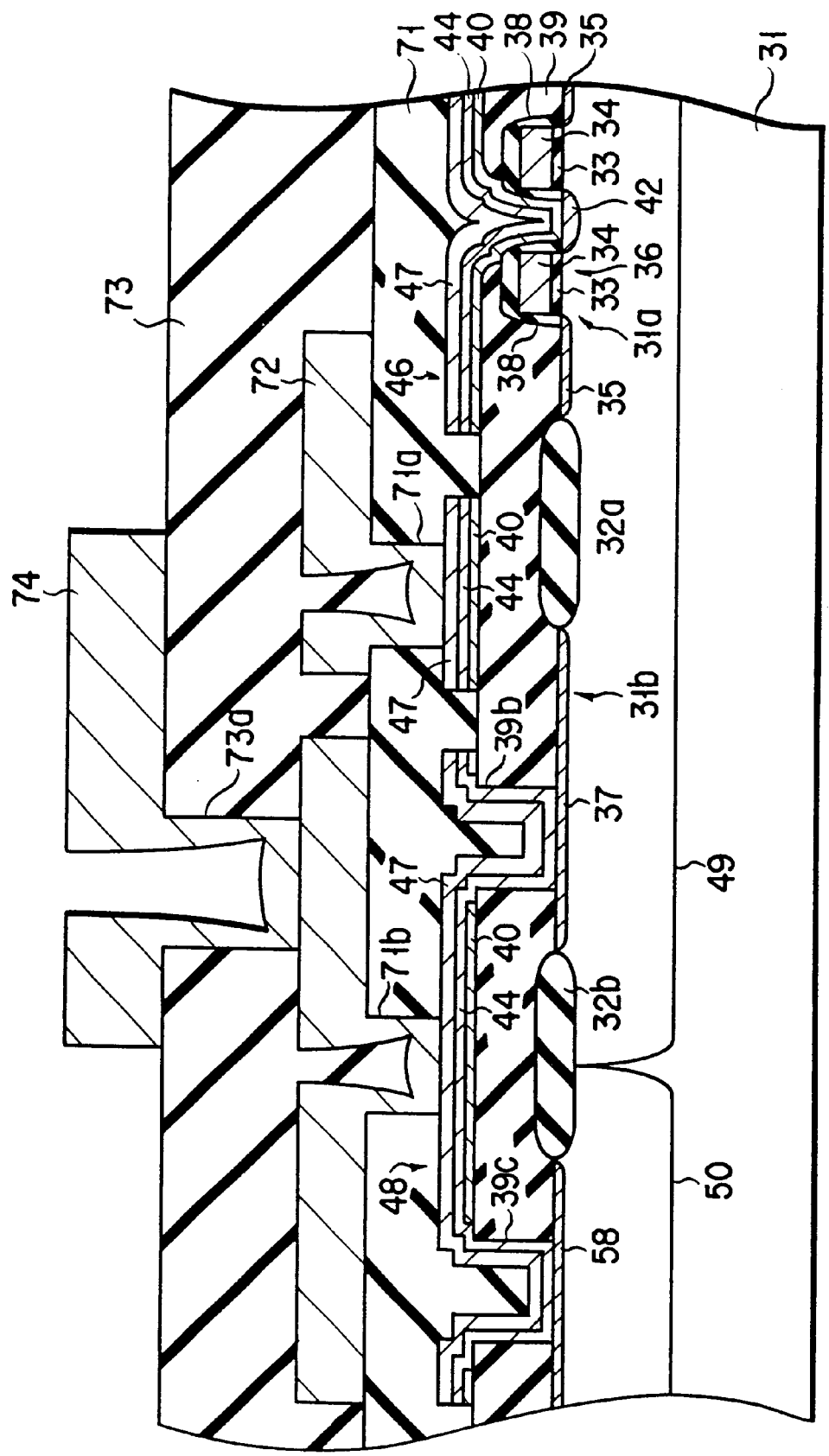
FIG. 19 is a cross sectional view, showing a semiconductor device according to a sixth embodiment of the invention.

FIG. 19 is a cross sectional view, showing a semiconductor device according to a sixth embodiment of the invention. In FIG. 19, elements similar to those in FIG. 13 are denoted by corresponding reference numerals, and an explanation will be given only of different elements.

A P-type well region 49 and an N-type well region 50 are formed in the surface of the P-type silicon substrate 31, and then first and second element separating films 32a and 32b are formed on the surface of the substrate 31 to divide the substrate 31 into a memory cell region 31a and a peripheral circuit region 31b.

Subsequently, N-type diffusion layers 35 and 37 are formed in the P-type well region 49, while a P-type diffusion layer 58 is formed in the N-type well region 50.

Then, a first interlayer insulating film 39 is formed on the insulating film 38, the P-type silicon substrate 31 and the element separating oxide films 32a and 32b, and a first contact hole 39a is formed in the interlayer insulating film 39. Thereafter, a polysilicon film 40 is deposited on the inner surface of the contact hole 39a and the first interlayer insulating film 39.

A resist film (not shown) is formed on the polysilicon film 40, and used as a mask to etch the film 40. Then, the first interlayer insulating film 39 is etched by the RIE, using the resist film as a mask, thereby forming second and third contact holes 39b and 39c a fourth contact hole (not shown) in the first interlayer insulating film 39 in the peripheral circuit region 31b. The second contact hole 39b extends to the $N^+$-type diffusion layer 37, while the third contact hole 39c extends to the $P^+$-type diffusion layer 58. The fourth contact hole extends to a gate electrode (not shown).

Thereafter, the resist film is removed, and a laminated film 44 consisting of a TiN upper layer and a Ti lower layer is formed by sputtering on the inner surfaces of the second and third contact holes 39b and 39c and on the polysilicon film 40. $TiSi_2$ films are formed on the bottom surfaces of the second and third contact holes 39b and 39c and on the polysilicon film 40, and then a metal (e.g. W) film 47 is formed on the laminated film 44. The metal film 47, the laminated film 44 and the polysilicon film 40 are patterned. As a result, a bit line 46 consisting of the metal film 47, the laminated film 44 and the polysilicon film 40 is formed in the memory cell region 31a, and a wire layer 48 having the same level of the bit line and consisting of the metal film 47, the laminated film 44 and the polysilicon film 40 is formed in the peripheral circuit region 31b.

Thereafter, a second interlayer insulating film 71 is deposited on the metal film 47 and the first interlayer insulating film 39, and is provided with fifth and sixth contact holes 71a and 71b formed therein and extending to the bit-line-level wire layer 48. A laminated film (not shown) consisting of a TiN upper layer and a Ti lower layer is formed on the inner surfaces of the contact holes 71a and 71b and on the second interlayer insulating film 71. An Al alloy film 72 is provided on this laminated film. Subsequently, the Al alloy film and the laminated film are patterned, therefore a first Al wire 72 is provided on the laminated film, and then a third interlayer insulating film 73 is deposited on the first Al wire 72 and the second interlayer insulating film 71. A seventh contact hole 73a is formed in the interlayer insulating film 73 such that it extends to the first Al wire 72. Thereafter, a second Al wire 74 is formed on the inner surface of the seventh contact hole 73a and on the third interlayer insulating film 73.

The above-described sixth embodiment can provide the same advantage as the third embodiment.

The first Al wire 72 can be directly connected to the $N^+$-type diffusion layer 37 and the $P^+$-type diffusion layer 58 through a contact hole formed in the first and second interlayer insulating films 39 and 71. In this (conventional) structure, the contact hole has a great depth, and hence the first Al wire 72 may be broken in the contact hole. In the sixth embodiment, however, the wire 72 is connected to the diffusion layers 37 and 58 through the wire layer 48 without such a deep contact hole. Therefore, the sixth embodiment is free from breakage of a wire in a deep contact hole as in the above conventional structure.

More specifically, in the sixth embodiment, the wire layer 48 of a bit line level is connected to the $N^+$-type diffusion layer 37 and the $P^+$-type diffusion layer 58 through the second and third contact holes 39b and 39c formed in the first interlayer insulating film 39, and is led onto the first interlayer insulating film 39. The wire layer led on the film 39 is connected to the first Al alloy wire 72 through the sixth contact hole 71b formed in the second interlayer insulating film 71. Thus, the wire 72 can be connected to the diffusion layers 37 and 58 without a deep contact hole. As a result this structure is free from the conventional disadvantage that a wire may be broken in a deep contact hole.

In addition, there is another method for preventing breakage of a wire in a deep contact hole. In this method, a conductive layer made, for example, of W is filled in the deep contact hole, and the first Al wire 72 is formed on the conductive layer. To fill the hole, a technique for selectively growing W, which contains a small number of processes, may be employed. This technique, however, cannot be used unless a plurality of contact holes, if formed, have the same depth. In other words, the selective growth technique cannot uniformly fill contact holes of different depths to provide a flat surface. The technique cannot be used in the conventional case where a deep contact hole is formed in the first and second interlayer insulating films 39 and 71, and a shallow contact hole 71a is formed in the second interlayer insulating film 71. Therefore, the etching-back method must be employed to fill contact holes of different depths. However, the number of processes employed in the etching-back method is larger than that of the selective-growth technique of W. In the etching-back method, a filling member is deposited in the contact holes and on the second interlayer insulating film 71, and is then etched back to provide a flat surface.

In the sixth embodiment, however, it is not necessary to fill a deep contact hole by the etching-back method, and hence the wire is prevented from being broken in the contact holes. Moreover, the selective growth technique of W which includes a small number of processes can be used to fill the contact holes 71a and 71b, since the holes 71a and 71b have the same depth in the second interlayer insulating film 71.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device, comprising:
   a first diffusion layer formed in the surface of a semiconductor substrate;
   an insulating film formed on contact with said semiconductor substrate;
   a first contact hole formed in said insulating film to expose a surface of said first diffusion layer;
   a polysilicon film formed in direct contact with an inner surface of said first contact hole and in direct contact with the surface of said first diffusion layer exposed by said first contact hole;
   a second diffusion layer formed in the surface of said semiconductor substrate;
   a second contact hole formed in said insulating film to expose a surface of said second diffusion layer, and
   a film containing a Ti layer and a TiN layer and which is formed in direct contact with an inner surface of said second contact hole, in direct contact with the surface of said second diffusion layer exposed by said second contact hole, in direct contact with said insulating film and in direct contact with said semiconductor film.

2. The semiconductor device according to claim 1, wherein the Ti layer is formed as a lower layer, while the TiN layer is formed as an upper layer, and the Ti layer is in direct contact with the second diffusion layer.

3. A semiconductor device, comprising:
   a semiconductor substrate having a memory cell region and a peripheral circuit region;
   a first-conductivity type diffusion layer of a first MOSFET formed in the surface of said semiconductor substrate in said memory cell region;
   a first-conductivity type diffusion layer of a second MOSFET formed in the surface of said semiconductor substrate in said peripheral circuit region;
   a second-conductivity type diffusion layer of a third MOSFET formed in the surface of said semiconductor substrate in said peripheral circuit region;
   an insulating film formed on contact with said semiconductor substrate;
   a first contact hole formed in said insulating film and extending to said first-conductivity type diffusion layer of said first MOSFET;
   a polysilicon film formed in direct contact with an inner surface of said first contact hole and in direct contact with the surface of said first-conductivity type diffusion layer exposed by said first contact hole;
   a second contact hole formed in said insulating film and extending to said first-conductivity type diffusion layer of said second MOSFET;
   a third contact hole formed in said insulating film and extending to said second-conductivity type diffusion layer of said third MOSFET; and
   a film containing a Ti layer and a TiN layer and which is formed in direct contact with inner surfaces of said second and third contact holes, in direct contact with said insulating film and in direct contact with said semiconductor film.

4. The semiconductor device according to claim 3, wherein the Ti layer is formed as a lower layer, while the TiN layer is formed as an upper layer, and the Ti layer is in direct contact with the first-conductivity type diffusion layer of the second MOSFET and in direct contact with the second-conductivity type diffusion layer of the third MOSFET.

5. A semiconductor device, comprising:
   a first diffusion layer formed in the surface of a semiconductor substrate;
   an insulating film formed on contact with said semiconductor substrate;
   a first contact hole formed in said insulating film to expose a surface of said first difffusion layer;
   a polysilicon film formed in direct contact with an inner surface of said first contact hole;
   a second diffusion layer formed in the surface of said semiconductor substrate;
   a second contact hole formed in said insulating film to expose a surface of said second diffusion layer, and
   a film containing a Ti layer and a TiN layer and which is formed in direct contact with an inner surface of said second contact hole, in direct contact with said insulating film and in direct a contact with said semiconductor film.

6. The semiconductor device according to claim 5, wherein the Ti layer is formed as a lower layer, while the TiN layer is formed as an upper layer, and the Ti layer is in direct contact with the second diffusion layer.

7. A semiconductor device, comprising:
- a semiconductor substrate having a memory cell region and a peripheral circuit region;
- a first diffusion layer formed in the surface of said semiconductor substrate in said memory cell region;
- an insulating film formed on contact with said semiconductor substrate;
- a first contact hole formed in said insulating film to expose a surface of said first diffusion layer;
- a polysilicon film formed in direct contact with an inner surface of said first contact hole;
- a second diffusion layer formed in the surface of said semiconductor substrate in said peripheral circuit region;
- a second contact hole formed in said insulating film to expose a surface of said second diffusion layer, and
- a film containing a Ti layer and a TiN layer and which is formed in direct contact with an inner surface of said second contact hole, in direct contact with said insulating film and in direct contact with said semiconductor film.

8. The semiconductor device according to claim 7, wherein said first contact hole is filled with said semiconductor film.

9. The semiconductor device according to claim 7, wherein the Ti layer is formed as a lower layer, while the TiN layer is formed as an upper layer, and the Ti layer is in direct contact with the second diffusion layer.

10. A semiconductor device, comprising:
- a first diffusion layer formed in the surface of a semiconductor substrate;
- an insulating film formed on contact with said semiconductor substrate;
- a first contact hole formed in said insulating film to expose a surface of said first diffusion layer;
- a polysilicon film formed in direct contact with an inner surface of said first contact hole and in direct contact with the surface of said first diffusion layer exposed by said first contact hole;
- a second diffusion layer formed in the surface of said semiconductor substrate;
- a second contact hole formed in said insulating film to expose a surface of said second diffusion layer, and a film containing a Ti layer and a TiN layer and which is formed in direct contact with the surface of said second diffusion layer exposed by said second contact hole, in direct contact with said insulating film and in direct contact with said semiconductor film, thereby creating a low resistance contact with said second diffusion layer and a sificide at the junction between said film containing a Ti layer and a TiN layer and said semiconductor film.

11. The semiconductor device according to claim 10, wherein the Ti layer is formed as a lower layer, while the TiN layer is formed as an upper layer, and the Ti layer is in direct contact with the second diffusion layer.

12. The semiconductor device according to claim 1, wherein the semiconductor film has a step portion located around the second contact hole, the step portion exposing the surface of the insulating film.

13. The semiconductor device according to claim 3, wherein the semiconductor film has a step portion located around the second contact hole, the step portion exposing the surface of the insulating film.

14. The semiconductor device according to claim 5, wherein the semiconductor film has a step portion located around the second contact hole, the step portion exposing the surface of the insulating film.

15. The semiconductor device according to claim 7, wherein the semiconductor film has a step portion located around the second contact hole, the step portion exposing the surface of the insulating film.

16. The semiconductor device according to claim 10, wherein the semiconductor film has a step portion located around the second contact hole, the step portion exposing the surface of the insulating film.

\* \* \* \* \*

UNITED STATES PATENT AND TRADEMARK OFFICE
CERTIFICATE OF CORRECTION

PATENT NO. : 6,326,691 B1
DATED : December 4, 2001
INVENTOR(S) : Yusuke Kohyama et al.

It is certified that error appears in the above-identified patent and that said Letters Patent is hereby corrected as shown below:

Column 16,
Line 13, "sificide" has been replaced with -- silicide --.

Signed and Sealed this

Twenty-seventh Day of August, 2002

Attest:

Attesting Officer

JAMES E. ROGAN
Director of the United States Patent and Trademark Office